(12) United States Patent
Ekman et al.

(10) Patent No.: US 6,288,606 B1
(45) Date of Patent: Sep. 11, 2001

(54) LINEAR POWER AMPLIFIER ARRANGEMENT AND METHOD FOR ITS OPERATION

(75) Inventors: Tapani Ekman; Seppo Rosnell; Risto Väisänen, all of Salo (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/438,124

(22) Filed: Nov. 9, 1999

(30) Foreign Application Priority Data

Nov. 10, 1998 (FI) .......................................... 982435

(51) Int. Cl.[7] .............................. H01Q 11/12; H04B 1/04; H03F 1/14
(52) U.S. Cl. ...................... 330/51; 330/107; 330/124 R; 330/129; 330/149; 455/126; 455/103
(58) Field of Search ...................... 330/51, 107, 124 R, 330/129, 149; 455/126, 103

(56) References Cited

U.S. PATENT DOCUMENTS

| | | | |
|---|---|---|---|
| 5,023,937 | 6/1991 | Opas et al. | 455/126 |
| 5,191,338 | 3/1993 | Katz et al. | 342/352 |
| 5,834,975 | 11/1998 | Bartlett et al. | 330/278 |
| 5,862,461 | * 1/1999 | Yoshizawa et al. | 330/124 R |
| 6,147,555 | * 11/2000 | Posner et al. | 330/149 |

FOREIGN PATENT DOCUMENTS

| | | |
|---|---|---|
| 0883241 A1 | 5/1998 | (EP) . |
| 0876004 A2 | 11/1998 | (EP) . |
| 0883250 A2 | 12/1998 | (EP) . |
| 2654879 | 5/1991 | (FR) . |
| WO 93/18590 | 9/1993 | (WO) . |
| WO 96/19063 | 6/1996 | (WO) . |

* cited by examiner

*Primary Examiner*—Michael B Shingleton
(74) *Attorney, Agent, or Firm*—Perman & Green, LLP

(57) ABSTRACT

A linear power amplifier arrangement is used for providing a selectable amount of amplification to a radio frequency signal to be amplified. The arrangement comprises a first parallel amplifier branch and a second parallel amplifier branch and means for conducting the radio frequency signal to be amplified selectably to one of the parallel amplifier branches. Additionally it comprises in the first parallel amplifier branch a series connection of a predistorter and a nonlinear amplifier, where said predistorter is arranged to compensate for the nonlinearity of said nonlinear amplifier.

9 Claims, 4 Drawing Sheets

LINEAR POWER AMPLIFIER ARRANGEMENT AND METHOD FOR ITS OPERATION

TECHNOLOGICAL FIELD

The invention concerns generally the technology of power amplifiers or PAs used in radio frequency transmitters. Especially the invention concerns an arrangement for producing linear amplification effectively throughout a large dynamic range.

BACKGROUND OF THE INVENTION

A power amplifier is the component in a radio frequency transmitter that amplifies the signal to be transmitted to a power level high enough to be conducted to the output port (e.g. antenna port) of the transmitter. In systems employing digital linear modulation schemes the linearity of the power amplifier is a very important factor. Digital linear modulation means that the signal to be transmitted has a number of allowed phase- and amplitude states, whereby each allowed phase-amplitude combination represents a certain bit pattern in a bit stream used as the source of the modulation and constitutes a so-called constellation point in a phase-amplitude diagram. The power amplifier has to reproduce the phase-amplitude combinations of the signal to be transmitted so that the relative distances between the constellation points is not distorted; hence the strict requirements for linearity in the operation of the power amplifier.

A traditional linear power amplifier is a so-called Class A amplifier meaning that the amplifying component is not driven to output current cutoff at any allowed value of the driving voltage. If the driving voltage is a sinusoidal oscillation, the conduction angle of a Class A amplifier is said to be 360 degrees. The drawback of Class A amplifiers is their poor efficiency, which may theoretically be 50% but falls in most practical circuits to the order of 25 to 30%. The problem is made worse by the requirement of a large dynamic range which is typical to the mobile terminals of digital cellular radio systems. As an example we may consider a mobile telephone, where the difference between the lowest and highest values of transmitted power may be several tens of decibels. If the linear power amplifier is designed for maximal efficiency at one end (usually the high end) of the dynamic range by selecting the structural parameters of the amplifying semiconductor component in a suitable way, efficiency at the other end (the low end) of the dynamic range is bound to be poor. Correspondingly a relatively large amount of electric energy is wasted during operation in the latter end of the dynamic range. In portable radio devices like mobile telephones wasting energy means unnecessarily shortening the operating time before the next required recharging of batteries.

From the European patent application number 98660044.3, published in December 1998 and incorporated herein by reference, there is known an arrangement consisting of at least two parallel amplifier stages, of which only one is selected for use at any moment of time by setting the bias voltages of the amplifier stages to suitable values. In such a structure each of the parallel amplifier stages may have a different optimal power range which is a subset of the required dynamic range of the whole amplifier arrangement. A separate control circuit selects for use the amplifier stage whose optimal power range is closest to the momentarily required output power of the amplifier arrangement. A remarkable saving is achievable in comparison to a single linear power amplifier stage, but there remains the problem of the efficiency remaining under 50% even if continuous optimal operation is assumed. Additionally it has been shown that immediately after changing the selected amplifier branch a phase distortion occurs in the output signal, which is a detrimental effect in systems using continuous phase modulation.

SUMMARY OF THE INVENTION

It is an object of the present invention to provide a power amplifier arrangement with a relatively wide dynamic range and a good efficiency throughout it. It is a further object of the invention to realise the inventive amplifier arrangement with a small number of inexpensive components. Additionally it is an object of the invention to provide a method for operating such a power amplifier arrangement effectively throughout the dynamic range. A still further object of the invention is to reduce phase distortions in the power amplifier arrangement.

The objects of the invention are achieved by arranging the power amplifier arrangement to comprise at least two parallel amplifier branches, of which at least one comprises a nonlinear amplifier, and by predistorting the input signal of the nonlinear amplifier(s). The pursued reduction in phase distortions is achieved by using an adjustable phase shifter in at least one of the parallel amplifier branches.

It is characteristic to the power amplifier arrangement according to the invention that it comprises in its first parallel amplifier branch a series connection of a predistorter and a nonlinear amplifier, where said predistorter is arranged to compensate for the nonlinearity of said nonlinear amplifier.

The invention applies also to a radio communication device. The characteristic feature of the radio communication device is that it comprises in a linear power amplifier arrangement,
- a first parallel amplifier branch and a second parallel amplifier branch and selection means for conducting a radio frequency signal to be transmitted selectably to one of the parallel amplifier branches, and
- in the first parallel amplifier branch a series connection of a predistorter and a nonlinear amplifier, where said predistorter is arranged to compensate for the nonlinearity of said nonlinear amplifier; and a control block for controlling the operation of said selection means for selectively establishing the conduction of the radio frequency signal to be transmitted through either the first or the second parallel amplifier branch.

Additionally the invention applies to a method, having as its characteristic features the steps of selecting a first parallel amplifier branch for operation and
in the first parallel amplifier branch, nonlinearly predistorting the signal to be amplified and subsequently nonlinearly amplifying it so that the nonlinearities of the predistortion and amplification substantially cancel each other.

The general idea of composing the power amplifier arrangement from a number of parallel selectable amplifier branches is known as such, as we may see e.g. from the European patent application cited above in the description of prior art. In the present invention this basic principle has been developed further by employing at least one nonlinear power amplifier in at least one of the parallel amplifier branches. By biasing an amplifier for nonlinear operation it is possible to obtain a higher efficiency than with traditional linear Class A amplifiers. To compensate for the nonlinearity of the amplifier proper a predistorter is inserted in front of it to implement a similar nonlinearity with an opposite sign. The distorting impacts of the predistorter and the nonlinear amplifier cancel each other to a large extent and their combination works like a linear power amplifier.

The invention does not limit the number of the parallel amplifier branches in the power amplifier arrangement. Also the number of branches with a nonlinear amplifier is not specified by the invention, as long as there is at least one such branch. A switching arrangement or a functionally equivalent circuit is provided for selectively conducting the signal to be amplified through one of the parallel amplifier branches at any given moment. One functionally equivalent circuit could be a biasing arrangement according to the European patent application cited above in the description of prior art. A control block controls the operation of the switching arrangement so that the selection of the amplifier branch takes place according to the required output power of the power amplifier arrangement.

To eliminate the phase distortion related to the moment of changing the selected amplifier branch the invention employs a phase detecting and correcting arrangement consisting of at least one phase detector and at least one phase shifter. The phase detector compares the relative phase difference between the "old" and "new" amplifier branches for a moment before the actual change from the old amplifier branch to the new amplifier branch is made. The output signal of the phase detector is coupled to at least one phase shifter that drives the detected phase difference towards zero. An advantageous location for the phase shifter(s) is in each parallel amplifier branch immediately before or after the amplifying component of that branch.

BRIEF DESCRIPTION OF DRAWINGS

The novel features which are considered as characteristic of the invention are set forth in particular in the appended Claims. The invention itself, however, both as to its construction and its method of operation, together with additional objects and advantages thereof, will be best understood from the following description of specific embodiments when read in connection with the accompanying drawings.

Like parts in FIGS. 1 to 7 are designated with the same reference designators.

DETAILED DESCRIPTION OF THE INVENTION

Figure 1:
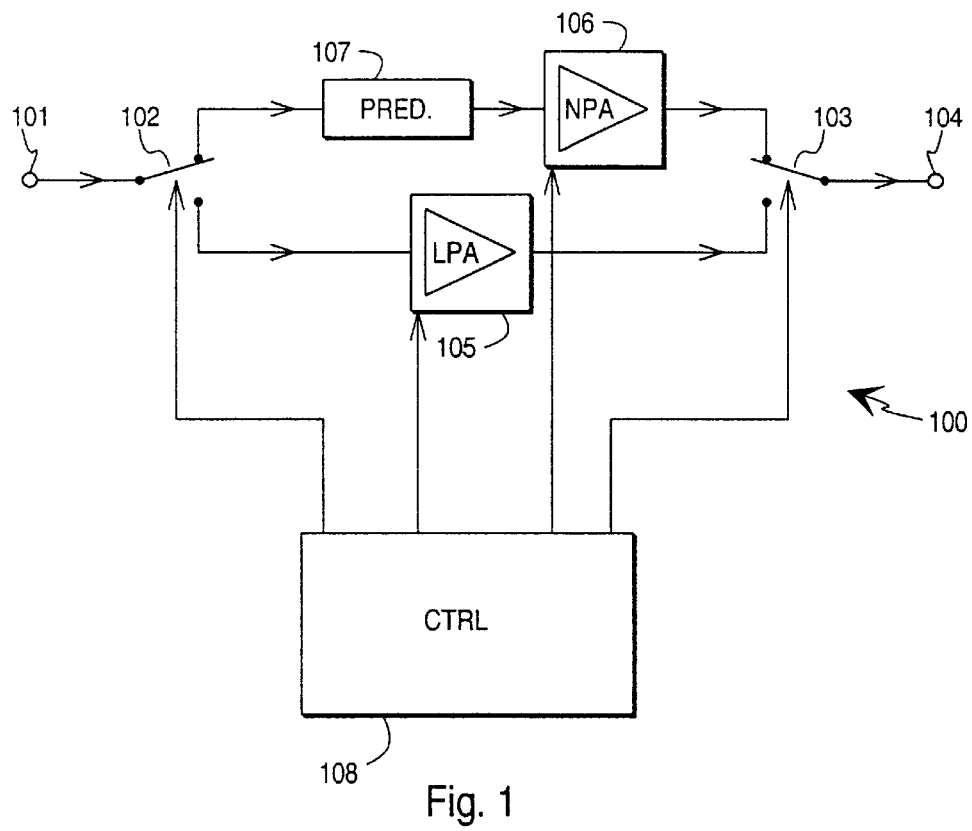
FIG. 1 illustrates an advantageous structure employing the principle of the invention.

FIG. 1 is a simplified block diagram of a certain linear power amplifier arrangement 100 according to the invention. It comprises an input port 101 for inputting a modulated radio frequency signal, a first switch 102 for directing the input signal into either the upper parallel amplifier branch or the lower amplifier branch, a second switch 103 for conducting an amplified signal out of either the upper parallel amplifier branch or the lower amplifier branch and an output port 104 for outputting an amplified version of the input signal. The lower parallel amplifier branch comprises a linear power amplifier 105 designed for optimal operation at the low end of the dynamic range of the linear power amplifier arrangement 100, and the upper parallel amplifier branch comprises a nonlinear power amplifier 106 designed for optimal operation at the high end of the dynamic range as well as a predistorter 107 coupled between the first switch 102 and the nonlinear power amplifier 106. Outside the actual power amplifier arrangement there is a control block 108 for controlling the operation of the switches 102 and 103 and adjusting the gain factor of the amplifiers 106 and 107. The terms "upper" and "lower" refer only to the graphical layout of FIG. 1 and does not restrict the structure or operation of the power amplifier arrangement in any way.

The linear power amplifier 105 may be a Class A amplifier known as such. Its structural parameters are selected so that its saturated power level lies relatively low in the required dynamic range of the whole linear power amplifier arrangement 100. Choosing the saturated power level of a linear amplifier by selecting its structural parameters is a technique known as such to the person skilled in the art. Because of its linearity, the linear power amplifier 105 does not have an efficiency over 50%. However, even this is a remarkable improvement in comparison to a prior art arrangement where there is only a single linear power amplifier for the whole dynamic range; the efficiency of such a prior art single linear power amplifier in the lower part of the dynamic range may be even below 10%.

Figure 2A:
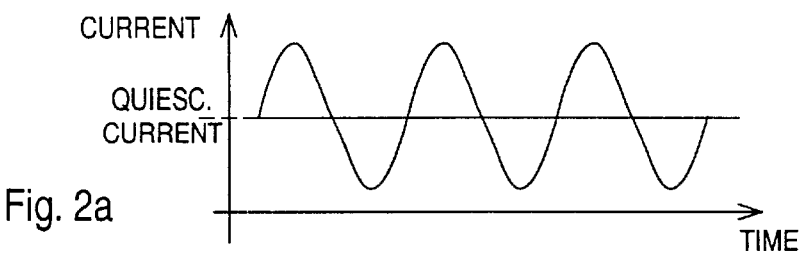
FIG. 2a to 2e show the conduction cycles of differently biased amplifiers and one resultant waveform.
Figure 2B:
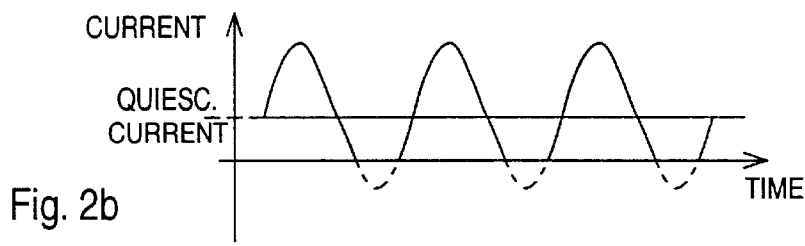
Figure 2C:
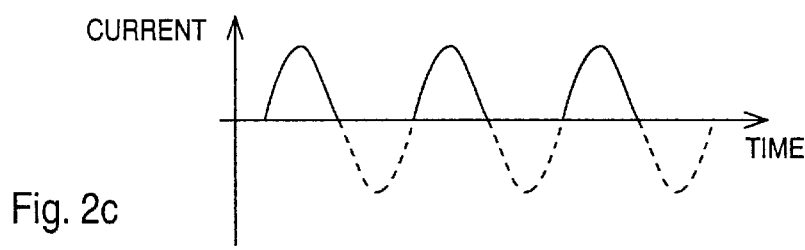
Figure 2D:
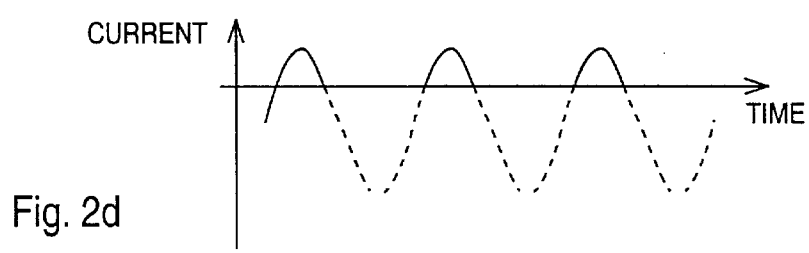

For the selection of the nonlinear power amplifier 106 a variety of amplifier classes and designs are available. FIGS. 2a to 2d present a comparison of the theoretical conducting cycles of Class A, Class AB, Class B and Class C amplifiers in this order. Class AB refers to a conduction angle of less than 360 but considerably greater than 180 degrees, Class B refers to a conduction angle of exactly 180 degrees and Class C refers to a conduction angle of less than 180 degrees. In each diagram the horizontal axis represents time and the vertical axis represents the output current of the amplifier. Units of the axes are arbitrary and not relevant to the following discussion. A sinusoidal input signal to the amplifier is assumed. The generally sinusoidal graphs shows the variation of the output current; dashed portions of the graphs in FIGS. 2b, 2c and 2d illustrate for graphical clarity the sinusoidal form during the intervals when no output current flows. FIGS. 2a and 2b show also the level of quiescent current as a straight horizontal line.

Figure 2E:
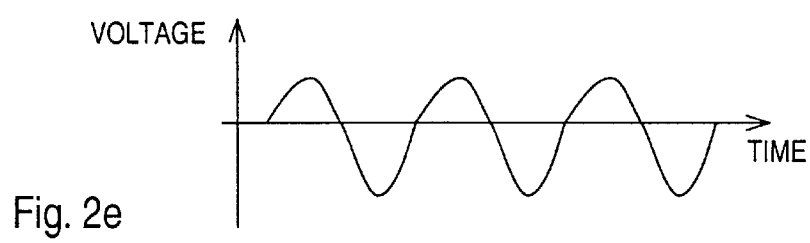

FIG. 2e illustrates an examplary resultant output waveform of a nonlinear amplifier. Here the horizontal axis represents time and the vertical axis represents the output voltage in some arbitrary units. The reduced amplitude of each positive wave section indicates the nonlinearity of the amplifier. Knowing the effect of the nonlinearity is essential for selecting the predistorter 107. If the nonlinear power amplifier 106 is of the type that produces a resultant output waveform like that in FIG. 2e, the predistorter 107 must provide an overemphasis of each positive wave section of the signal prior to it being input to the nonlinear power amplifier 106. This way the nonlinear impacts of the predistorter 107 and the nonlinear power amplifier 106 will cancel each other and their series connection will appear as a single linear power amplifier. Selecting a nonlinear power amplifier and a predistorter so that such cancellation occurs is called matching. The technique of matching a predistorter to a nonlinear power amplifier is known as such to the person skilled in the art. Care must be taken to match the frequency and amplitude dependencies of the two nonlinear components to each other.

The operation of the structure of FIG. 1 goes as follows. The control block 108 acquires knowledge about the currently required output power level of the linear power amplifier arrangement 100. Depending on the magnitude of the required output power level the control block 108 sets the switches 102 and 103 so that either the lower or the upper parallel amplifier branch is available as a signal path between the input port 101 and the output port 104. As a general rule, if the required output power level is higher than the saturated power level of the (low-power) linear power amplifier 105, the upper parallel amplifier branch is selected, and for required out-put power levels lower than said saturated power level the lower parallel amplifier branch is selected. The invention does not limit the algorithm that the control block uses for selecting the correct parallel amplifier branch. For fine-tuning the actual output power level to a value as close as possible to the required value the control block tunes the gain factor of the amplifier in the selected parallel amplifier branch.

If the control block 108 has set the switches 102 and 103 to the "low" position, the input signal is fed from the input port 101 through the first switch 102 to the linear power amplifier 105 and amplified to the desired output power level (actually as much higher than the desired output power level as is the expected attenuation in the second switch 103). The resulting signal is fed through the second switch 103 to the output port 104 and further to the antenna or output line of the radio apparatus where the arrangement 100 is located. Correspondingly, if the control block 108 has set the switches 102 and 103 to the "high" position, the input signal is fed from the input port 101 through the first switch 102 to the predistorter 107 and the resulting predistorted signal is fed into the nonlinear power amplifier 106 for amplification. The resulting signal is again fed through the second switch 103 to the output port 104 and further to the antenna or output line.

For assuring that the output power level remains at the desired value, a feedback loop is usually provided, although such feedback loop is not shown in FIG. 1. It comprises a directional coupler either between each amplifier 10s or 106 and the second switch 103 or between the second switch 103 and the output port 104 or even beyond the output port 104. Additionally the feedback loop comprises a feed-back connection from the directional coupler to the control block 108. By using the directional coupler the control block continuously monitors the actual achieved output power level and tunes the amplifier in the selected parallel amplifier branch so that the measured output power level stays within a predetermined error marginal from its desired value.

Figure 3:
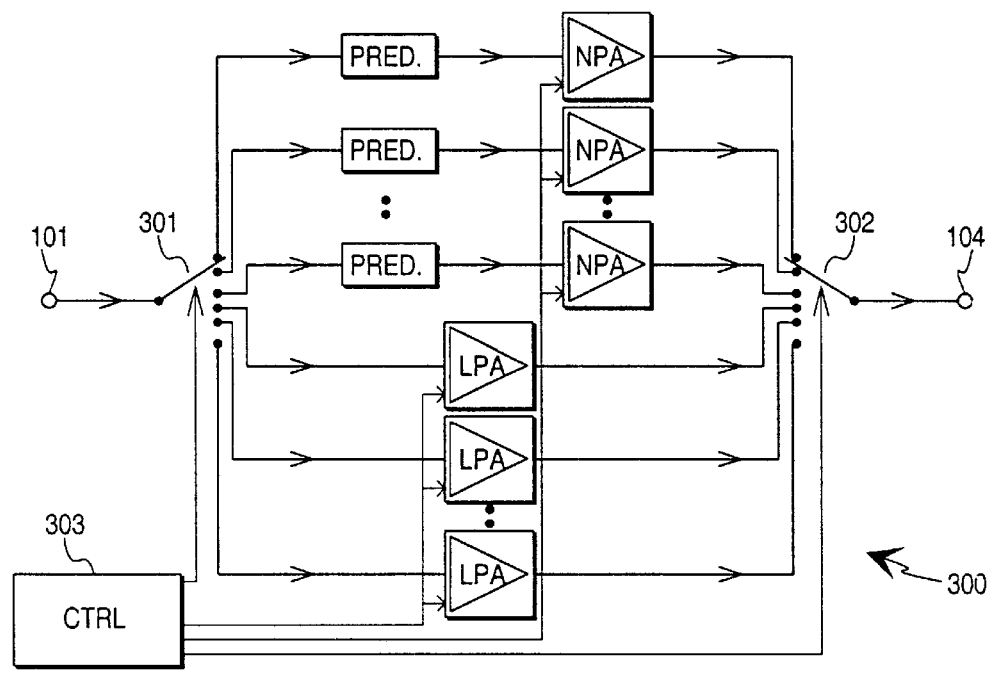
FIG. 3 illustrates a generalisation of the structure of FIG. 1.

FIG. 3 illustrates a generalisation of the structure shown in FIG. 1. In FIG. 3, the linear power amplifier arrangement 300 comprises an input port 101, a first multiposition switch 301, a second multiposition switch 302 and an output port 104. Between the multiposition switches 301 and 302 the arrangement comprises M+N parallel amplifier branches, of which M branches comprise a linear power amplifier LPA and N branches comprise a series connection of a predistorter PRED and a nonlinear power amplifier NPA. The integers M and N are selected to that M is greater than or equal to zero and N is greater than zero. M and N need not be equal. By selecting M=1 and N=1 we would get the structure of FIG. 1. A control block 303 controls the operation of the switches 301 and 302 and tunes the amplifiers in the parallel amplifier branches.

In the structure of FIG. 3, all amplifiers LPA and NPA have differently dimensioned structural parameters so that one of the nonlinear power amplifiers NPA is dimensioned for optimal operation at the highest power level of them all, and one of the linear power amplifiers LPA is dimensioned for optimal operation at the lowest power level of them all. The dimensioning of the other amplifiers fall between these extremes preferably so that somewhere in the middle of the required dynamic range of the whole linear power amplifier arrangement 300 there is a limit which is greater than or equal to the saturated power level of all linear power amplifiers and smaller than or equal to the saturated power level of all nonlinear power amplifiers. The operation of the structure illustrated in FIG. 3 follows the description given above in connection with FIG. 1 with the exception that the control block 303 now has more alternatives for selecting the optimal one of the parallel amplifier branches.

In the description above we have referred exclusively to switches as the arrangement that conducts the signal to be transmitted through only one of the parallel amplifier branches at a time. Although the switches represent the most readily understood means of selectively conducting a signal between certain parts of an electrical circuit, the invention is in no way limiting in this respect. The selection of a certain parallel amplifier branch may be achieved for example by suitable biasing of some active components in the parallel amplifier branches. To realise an embodiment based on biasing, the control lines connecting the control block to the switches in FIGS. 1 and 3 must be replaced by biasing lines from a controlling unit to the corresponding active components.

Although the controlling functions have been shown in FIGS. 1 and 3 as incorporated into a single control block, it is perfectly possible to distribute the same functions to two or more locations in the circuitry around the linear power amplifier arrangement.

Figure 4:
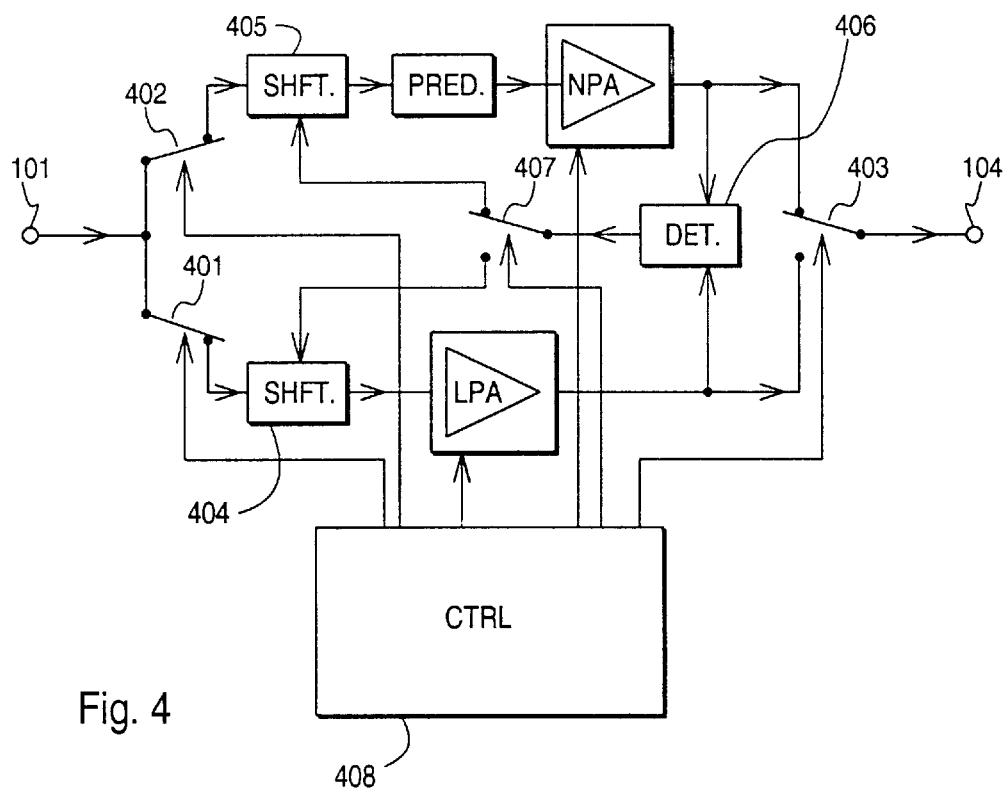
FIG. 4 illustrates an advantageous phase detection and correction arrangement in a structure according to the invention.

If the arrangement of FIG. 1 or FIG. 3 is used for the amplification of continuous phase modulated signals, the problem of potential phase distortion emerges in association with changing the selected parallel amplifier branch. FIG. 4 illustrates a way of reducing such phase distortion to a negligible value. For graphical clarity the linear power amplifier arrangement FIG. 4 consists again of only two parallel amplifier branches; it is clear to the person skilled in the art that the same idea is easily generalised to a multi-branch arrangement like that in FIG. 3.

The linear power amplifier arrangement of FIG. 4 comprises an input port 101, a first switch 401, a second switch 402, a third switch 403 and an output port 102. The first and second switches 401 and 402 take the place of a first switch 102 in FIG. 1 or the first multiposition switch 301 in FIG. 3. Between the first switch 401 and the third switch 403 there is a lower amplifier branch comprising a low-power linear power amplifier LPA and between the second switch 402 and the third switch 403 there is an upper amplifier branch comprising a predistorter PRED and a high-power nonlinear power amplifier NPA. Both branches comprise additionally an adjustable phase shifter 404 and 405 and from each branch there is a connection to a phase detector 406, the output signal of which is arranged to adjust the phase shift implemented by either the phase shifter 404 or the phase shifter 405. The selection of which phase shifter is adjusted takes place according to the position of a selection switch 407. The mutual order of the components in each parallel amplifier branch is not important to the invention as long as the connection to the phase detector 406 is made from a point that is later in relation to the progress of a signal than the phase shifter in the respective branch (in other words, it does not make sense to measure the phase of a signal prior to the phase shifter). A control block 408 is arranged to set the switches and tune the amplifiers.

The operation of the arrangement illustrated in FIG. 4 is as follows. Under unchanging conditions one of the parallel amplifier branches is selected for use by closing the respective one of the switches 401 and 402 and opening the other and by setting the third switch 403 to conduct the signal from the selected branch to the output port 104. When the control block 408 realizes that it has to change the selected branch, it commences the change by initiating a so-called phase correction mode. During this mode both the first switch 401 and the second switch 402 are closed so that half of the power of the input signal is fed into each of the parallel amplifier branches. The gain factor of the amplifier in the old branch is simultaneously increased to compensate for the drop in input power; this may be an automatic procedure for execution by the control block or it will follow from the normal operation of the feedback control loop which is not shown in FIG. 4 but which has been described above.

During the phase correction mode the phase detector 406 compares the phase of the signal in the new branch to that of the signal in the old branch. Simultaneously or nearly simultaneously with closing both switches 401 and 402 the control block 408 has set the selection switch 407 to conduct the output signal of the phase detector 406 to the phase shifter in the new branch. The phase detector 406 produces an output signal that is proportional to the detected phase difference. When conducted to the adjustable phase shifter in the new branch this output signals serves to shift the phase in the new branch so that the phases in the two branches become equal. Only after the phase difference has been eliminated does the control block end the phase correction mode and actually select the new branch by changing the position of the third switch 403. Thereafter (or simultaneously) the control block may open the one of the switches 401 and 402 that leads to the old branch, and simultaneously decrease the gain factor of the amplifier in the new branch because the whole input power will now be conducted to the new branch. The gain factor adjustment may again take place either as a preprogrammed procedure or as a consequence of the normal feedback loop power control.

A suitable latch arrangement is easily constructed to hold the correct control signal value for the phase shifter in the selected branch even after the phase correction mode has ended. As with the arrangements of FIGS. 1 and 3, a person skilled in the art may easily replace the switches by some other known means of conducting a signal between desired locations in a circuit. The ending of the phase correction mode may take place after a preprogrammed time period which is long enough for the phase detector+phase shifter arrangement to eliminate the phase difference, or there may be a connection from the phase detector to the control block for indicating to the control block the moment when suitable phase correction has been established. The latter arrangement is more flexible in taking into account the actual operation of the circuit, but it necessitates a slightly more complicated structure.

Figure 5:
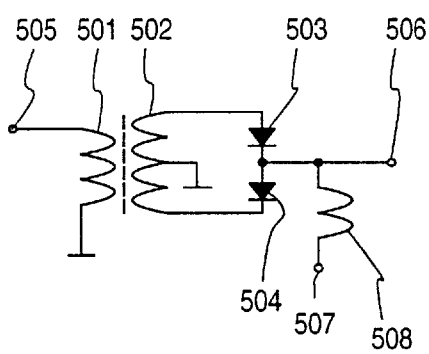
FIG. 5 illustrates a detail of the structure in FIG. 4.

Several arrangements suitable for use as the phase detector 406 and the phase shifters 404 and 405 are known as such from prior art. FIG. 5 illustrates a mixer that is also applicable as a phase detector. It comprises a first inductance 501 and a second inductance 502 electromagnetically coupled to the first inductance. One end of the first inductance and the middle point of the second inductance are grounded and a pair of diodes 503 and 504 connected in series connect the ends of the second inductance. The input points of the mixer/phase detector are at the other end 505 of the first inductance and at the middle point 506 of the diode connection. An output signal is obtained at an output port 507 which is coupled through a third inductance 508 to the middle point of the diode connection. When the signals brought to the inputs 505 and 506 have the same frequency, a DC signal is obtained at the output port 507; the level of this DC signal is proportional to the phase difference of the input signals.

Figure 6:
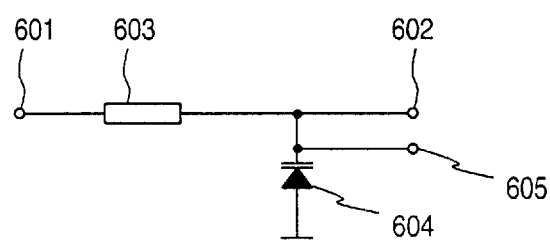
FIG. 6 illustrates another detail of the structure in FIG. 4.

A simple adjustable phase shifter which is applicable to the circuit of FIG. 4 is seen in FIG. 6 and comprises an input port 601, an output port 602, a reactance 603 between the input port and the output port, a capacitance diode 604 reversely connected between the output port and the ground potential, and a tuning port 605 at the cathode of the capacitance diode. The phase shift experienced by a signal on its way from the input port to the output port is proportional to the value of the DC voltage brought to the tuning port.

Figure 7:
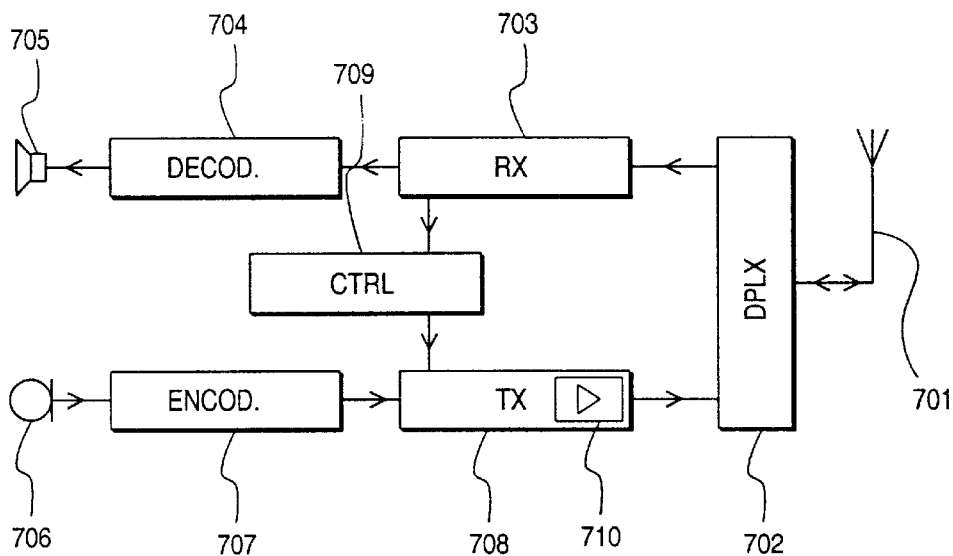
FIG. 7 illustrates a radio communication device according to the invention and FIG. 8 is a flow diagram representation of a method according to the invention.

FIG. 7 is a simplified block diagram of a mobile telephone which serves as an exemplary radio communication device where the invention is applicable. The mobile telephone comprises an antenna 701, a duplexing block 702, a receiving branch 703, a speech decoder 704, a loudspeaker 705, a microphone 706, a speech encoder 707, a transmitting branch 708 and a control block 709. The mobile telephone may naturally comprise a large number of other functional blocks. According to the invention, the transmitting branch 708 is otherwise comparable to the transmitting branches in prior art mobile telephones but comprises, as its final amplification stage before the connection between the transmitting branch 708 and the duplexing block 702, a linear power amplifier arrangement 710 according to the invention as described above. The control block 709 is arranged to, among other things, exchange power control messages with a base station of the cellular radio system in which the mobile telephone is arranged to operate. After having received a power control message from the base station (not shown) the control block checks, whether the power control message contains an order to change the transmission power level of the mobile telephone so that a change of selected branch in the linear power amplifier arrangement 710 should be accomplished. If it does, the control block executes the change by implementing the functions that have been allocated to the control block in the previously given explanation of the embodiments in FIG. 1, 3 and 4.

Figure 8:
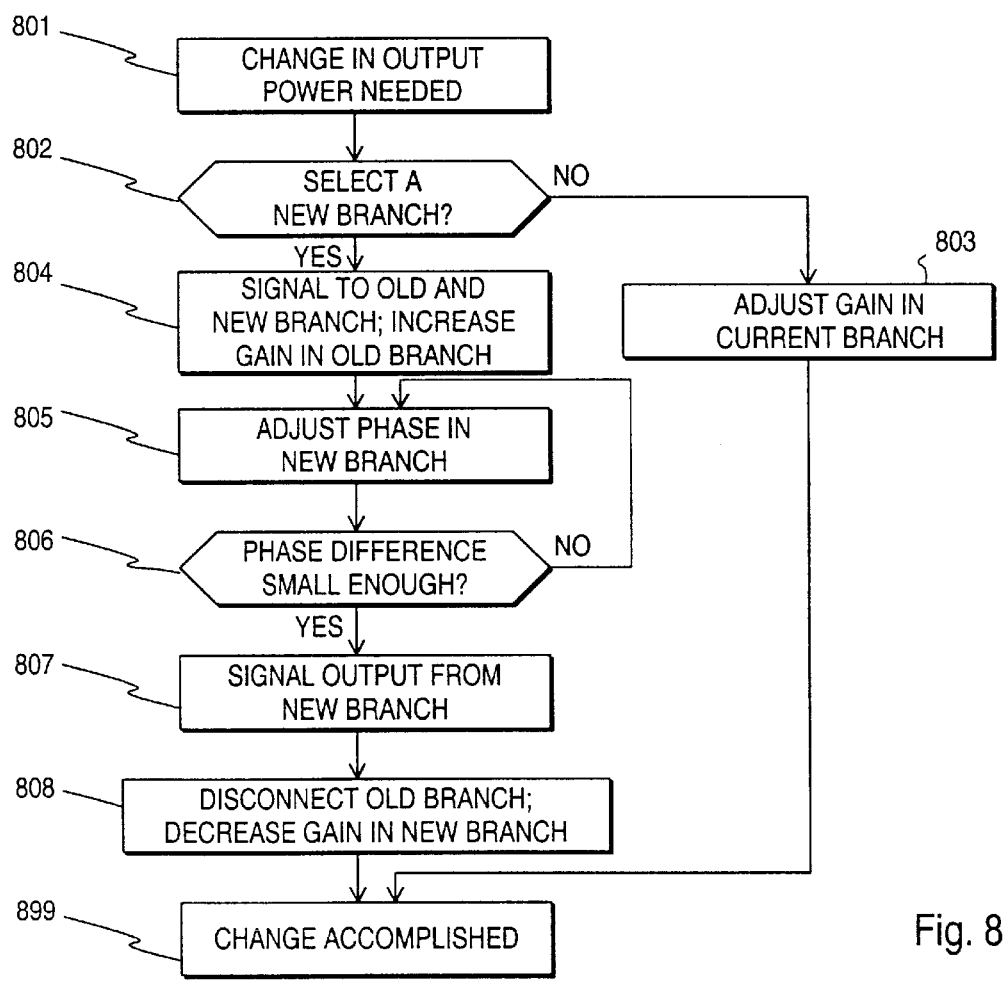

To conclude with we will summarize an advantageous embodiment of the method according to the invention by reference to FIG. 8. Here we will assume that phase distortion correction is applied and that gain factor adjustment is a preprogrammed part of the method. At stage 801 there is realised a need for changing the output power level of a linear power amplifier arrangement. At stage 802 a check is made to see whether the change will imply a change from an old selected amplifier branch to a new one. A negative finding causes an adjustment to be made in the currently selected amplifier branch at stage 803 followed by a jump to the end state 899. A positive finding at stage 802 causes the system to enter a phase correction mode, where the conduction of the input signal to both the old and new branches is accompanied with an adjustment of the gain factor in the old branch at stage 804. During the loop through stages 805 and 806 the phase difference will be eliminated. After stage 806 the new branch will be selected for use at stage 807, and the old branch is disconnected at stage 808 together with a respective adjustment in the gain factor of the amplifier in the new branch.

What is claimed is:

1. A linear power amplifier arrangement for providing a selectable amount of amplification to a radio frequency signal to be amplified, comprising:

a first parallel amplifier branch and a second parallel amplifier branch, means for conducting the radio frequency signal to be amplified selectably to one of the parallel amplifier branches, and in the first parallel amplifier branch a series connection of a predistorter and a nonlinear amplifier, wherein said predistorter is arranged to compensate for the nonlinearity of said nonlinear amplifier;

a first adjustable phase shifter in the first parallel amplifier branch;

a second adjustable phase shifter in the second parallel amplifier branch; and a phase detector arranged to compare the phases of signals in the first and second parallel amplifier branches and to adjust at least one of said first and second adjustable phase shifters as a response to said comparison of phases.

2. The linear power amplifier arrangement of claim 1, comprising in the second parallel amplifier branch a linear amplifier.

3. The linear power amplifier arrangement of claim 1, comprising in the second parallel amplifier branch a series connection of a predistorter and a nonlinear amplifier.

4. The linear power amplifier arrangement of claim 1, wherein the linear power amplifier arrangement has a certain dynamic range of amplification extending from a low end to a high end, the first parallel amplifier branch is dimensioned for maximal efficiency at the high end of the dynamic range, and the second parallel amplifier branch is dimensioned for maximal efficiency at the low end of the dynamic range.

5. The linear power amplifier arrangement of claim 1, comprising a nonzero integer number of parallel amplifier branches with a separate series connection of a predistorter and a nonlinear amplifier in each of them, and additionally comprising an integer number of parallel amplifier branches with a linear amplifier in each of them.

6. A radio communication device for processing and transmitting a radio frequency signal with a selectable transmission power, comprising:

a linear power amplifier arrangement for amplifying the radio frequency signal to a selected power level;

the linear power amplifier arrangement comprising:

a first parallel amplifier branch and a second parallel amplifier branch and selection means for conducting the radio frequency signal to be transmitted selectably to one of the parallel amplifier branches, and in the first parallel amplifier branch a series connection of a predistorter and a nonlinear amplifier, where said predistorter is arranged to compensate for the nonlinearity of said nonlinear amplifier; and a control block for controlling the operation of said selection means for selectively establishing the conduction of the radio frequency signal to be transmitted through either the first or the second parallel amplifier branch; and means for operating as a terminal of a cellular radio system which comprises a number of base stations, so that said control block is arranged to process power control messages received from a base station and to establish the need for selecting a new parallel amplifier branch in the linear power amplifier arrangement on the basis of processed power control messages.

7. The radio communication device of claim 6, additionally comprising means for operating as a terminal of a cellular radio system employing continuous phase modulation, whereby the radio communication device further comprises, in association with the linear power amplifier arrangement, a first adjustable phase shifter in the first parallel amplifier branch, a second adjustable phase shifter in the second parallel amplifier branch and a phase detector arranged to compare phases of signals in the first and second parallel amplifier branches and to adjust at least one of said first and second adjustable phase shifters as a response to said comparison of phases.

8. A method for adjusting an output power of a linear power amplifier arrangement comprising a first parallel amplifier branch and a second parallel amplifier branch, the method comprising the steps of selecting the first parallel amplifier branch for operation; and in the first parallel amplifier branch, nonlinearly predistorting a signal to be amplified and subsequently nonlinearly amplifying it so that the nonlinearities of the predistortion and amplification substantially cancel each other; and before selecting the first parallel amplifier branch for operation, having the second parallel amplifier branch selected for operation;

enabling a conduction of the signal to be amplified to both the first parallel amplifier branch and the second parallel amplifier branch;

measuring a phase difference between a signal in the first parallel amplifier branch and a signal in the second parallel amplifier branch;

shifting a phase of the signal in the first parallel amplifier branch to make it coincident with a phase of the signal in the second parallel amplifier branch;

conducting the signal amplified in the first parallel amplifier branch out of the linear power amplifier arrangement as its output signal; and disabling the conduction of the signal to be amplified to the second parallel amplifier branch.

9. The method of claim 8 further comprising the steps of:

in association with enabling the conduction of the signal to be amplified to both the first parallel amplifier branch and the second parallel amplifier branch, increasing a gain factor of the second parallel amplifier branch; and in association with disabling the conduction of the signal to be amplified to the second parallel amplifier branch, decreasing a gain factor of the first parallel amplifier branch.

* * * * *